United States Patent
Lee et al.

(10) Patent No.: US 10,839,889 B1
(45) Date of Patent: Nov. 17, 2020

(54) APPARATUSES AND METHODS FOR PROVIDING CLOCKS TO DATA PATHS

(71) Applicant: MICRON TECHNOLOGY, INC., Boise, ID (US)

(72) Inventors: Hyunui Lee, Sagamihara (JP); Chiaki Dono, Chigasaki (JP); Chikara Kondo, Hachioji (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/591,566

(22) Filed: Oct. 2, 2019

(51) Int. Cl.
```
G11C 7/10      (2006.01)
G11C 7/22      (2006.01)
G11C 11/4076   (2006.01)
H01L 25/065    (2006.01)
H01L 25/18     (2006.01)
G06F 13/16     (2006.01)
G11C 11/4093   (2006.01)
```

(52) U.S. Cl.
CPC ...... *G11C 11/4076* (2013.01); *G06F 13/1668* (2013.01); *G11C 7/1051* (2013.01); *G11C 7/22* (2013.01); *G11C 11/4093* (2013.01); *H01L 25/0657* (2013.01); *H01L 25/18* (2013.01); *G11C 2207/107* (2013.01); *H01L 2225/06513* (2013.01); *H01L 2225/06541* (2013.01)

(58) Field of Classification Search
CPC .... G11C 7/22; G11C 7/1051; G11C 2207/107
USPC ..... 365/219, 189.15, 189.16, 233.11, 233.12
See application file for complete search history.

(56) References Cited

U.S. PATENT DOCUMENTS

| | | | | |
|---|---|---|---|---|
| 7,333,908 B2* | 2/2008 | Johnson | ........... | G01R 31/31716 |
| | | | | 702/107 |
| 8,509,020 B2* | 8/2013 | Kajigaya | ............... | G11C 7/1006 |
| | | | | 365/219 |
| 10,365,325 B2* | 7/2019 | Dono | ............... | G01R 31/31716 |
| 2006/0253663 A1* | 11/2006 | Johnson | ............... | G11C 7/1048 |
| | | | | 711/154 |

* cited by examiner

*Primary Examiner* — Son L Mai
(74) *Attorney, Agent, or Firm* — Dorsey & Whitney LLP

(57) ABSTRACT

Apparatuses and methods for providing clocks to data paths are disclosed. An example apparatus includes a first circuit in a data path, a second circuit in the data path, and a multiplexer. The first circuit is configured to provide data based on a first clock and the second circuit is configured to receive the data and provide the data based on a second clock. The multiplexer is configured to provide a third clock as the second clock for some test operations and further configured to provide the first clock as the second clock for other test operations. A timing of the first clock is adjusted for the first circuit during the test operations.

20 Claims, 6 Drawing Sheets

US 10,839,889 B1

APPARATUSES AND METHODS FOR PROVIDING CLOCKS TO DATA PATHS

BACKGROUND

A memory device called High Bandwidth Memory (HBM) has a configuration in which a plurality of memory core chips are stacked on an interface chip. At a manufacturing step of an HBM, an operation test in a state where the memory core chips are stacked on the interface chip is performed as well as an operation test for a unit of the interface chip or a unit of the memory core chips is performed. The operation test in the state where the memory core chips are stacked on the interface chip needs to be performed via an external terminal provided on the interface chip.

However, the external terminal provided on the interface chip is quite small in size and probing thereto is difficult. Accordingly, a test interface, for example, a test terminal called "direct access terminal," may be provided on the interface chip in addition to the general external terminal. The test interface may be used for testing input-output and memory cell functionality, for example.

When testing AC characteristics of the HBM using the test interface, issues may arise because multiple internal clocks may be operating during test operations. For example, during test operations, three clocks may be used in a data queue (DQ) cell during testing. For the proper operation, each of the clocks need to be set in correct timing. The correct timing can be identified by clock adjusting a timing of the clocks (e.g., sweeping the clock timing) and checking the results of the adjusted clocks. Since there are three clocks, however, number of iterations of clock sweep and checking result procedure increases exponentially and it also increases test time.

DETAILED DESCRIPTION

Certain details are described to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

Figure 1:
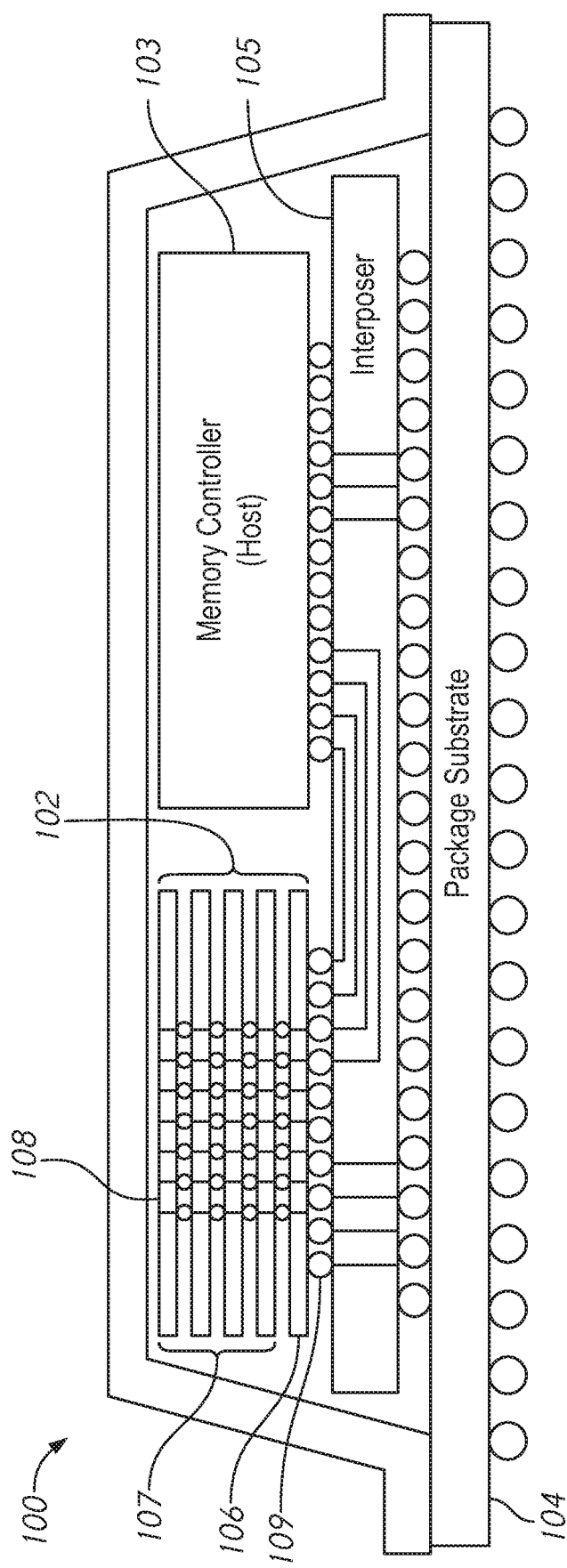
FIG. 1 is a schematic diagram of a semiconductor device including an interface logic die and a plurality of core die according to an embodiment of the disclosure.

FIG. 1 is a schematic diagram of a semiconductor device including an interface logic die and a plurality of core die according to an embodiment of the disclosure. For example, the semiconductor device 100 may include a three-dimensional (3D) memory device 102 and a memory controller 103 (or a host device including a memory controller. The memory device 102 and the memory controller 103 may be included on an interposer 105, which is coupled to a package substrate 104. The interposer 105 may interconnect the memory controller 103 and the memory device 102. For example, the 3D memory device 102 may be an HBM, an HMC, a Wide-IO dynamic random access memory (DRAM), etc. The 3D memory device 102 may include an interface die 106 and core die 107 stacked with each other. Each core die 107 may be a memory die that may include a memory array and a plurality of channels. The memory die may be DRAM, for example. Each channel may include a plurality of circuits for accessing memory cells of the memory array. The memory cells may be DRAM memory cells. The 3D memory device 102 may include conductive vias 108 (e.g., TSVs) which couple the interface die 106 and core die 107. The interface die 106 may be coupled to the interposer 105 via interconnects, such as conductive bumps 109. For example, the conductive bumps 109 may be microbumps having bump pitches of less than about or less than one hundred micro meters and exposed on an outside of the interface die 106.

Figure 2:
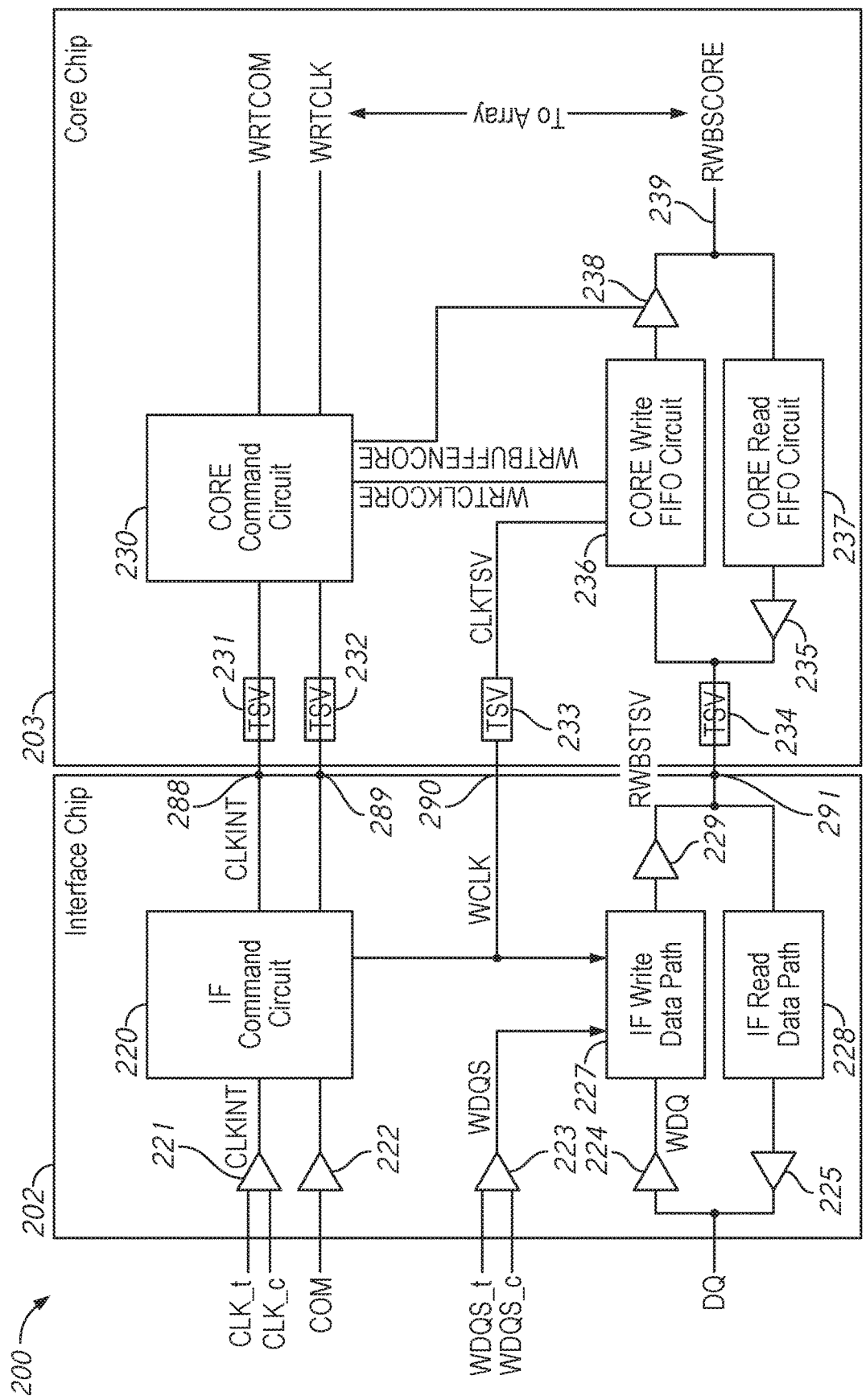
FIG. 2 is a schematic diagram of an interface die and a core die in a memory device according to an embodiment of the disclosure.

FIG. 2 is a schematic diagram of an interface die 202 and a core die 203 in a memory device 200 according to an embodiment of the disclosure. In some embodiments of the disclosure, the memory device 200 may be included in the semiconductor device 100 as memory device 102.

The memory device 200 may be an HBM, an HMC, a Wide-IO DRAM, etc. The memory device 200 may include the interface die 202 and a plurality of core die 203 stacked with each other. The memory device 200 may include conductive vias 231, 232, 233, 234 (e.g., through substrate electrodes or through silicon vias TSVs) which couple the interface die 202 and core die 203. For example, the conductive vias 231, 232, 233, 234 may couple to a clock terminal 288, a command terminal 289, a data strobe terminal 290 and a set of data terminals 291 of the interface die 202, respectively. Also, the interface die 202 may include a set of TSVs at a core die side coupled to an upper core die, and the plurality of core die 203 may include the TSVs 231, 232, 233, 234 at a core die side coupled to the upper core die instead of an interface die side coupled to the interface die 202.

In the interface die 202, an IF command circuit 220 may receive an internal clock signal CLKINT through a buffer 221 that receives complementary clock signals CLK_t and CLK_c provided to the memory device 200. The IF command circuit 220 may provide the internal clock signal CLKINT to the TSV 231 via the clock terminal 288. The IF command circuit 220 may also provide a write clock WCLK to the TSV 233 via the data strobe terminal 290 and to an IF Write Data Path 227. The IF command circuit 220 may receive a command signal COM through a buffer 222. The IF command circuit 220 may provide the command signal COM to the TSV 232 via the command terminal 289, responsive to the command signal COM indicative of a command (e.g., a write command for executing a write operation).

The strobe buffer 223 may receive active write data strobe signals WDQS_t and WDQS_c. The buffer 223 may provide the internal write data strobe signal WDQS to an IF write data path 227. The buffer 224 may provide write data WDQ from a data terminal DQ to the IF write data path 227 according to a timing based on the strobe signal WDQS. For example, the IF write data path 227 may capture the write data WDQ responsive to the internal write data strobe signal WDQS, and may further provide the write data WDQ to a buffer 229. The buffer 229 may function as a driver to provide a read/write bus TSV signal RWBSTSV to a set of data terminals 291. The set of data terminals 291 of the IF die 202 may be coupled to TSVs 234 in the core die 203. The read/write bus TSV signal RWBSTSV may include data from the IF write data path 227.

In the core die 203, a core command circuit 230 may receive the internal clock signal CLKINT from the IF command circuit 220 through the TSV 231. The core command circuit 230 may receive the command signal COM from the IF command circuit 220 through the TSV 232. The core command circuit 230 may provide a write internal clock signal WRTCLKCORE responsive to the command signal COM indicative of a write command and the internal clock signal CLKINT. The core command circuit 230 may also provide an active write command enable signal WRTCOM and a write clock WRTCLK.

The TSV 234 may provide the core data from the interface die 202. The core write FIFO circuit 236 may receive a write data strobe signal CLKTSV from the TSV 233. The core write FIFO 236 provides write data according to the write data strobe signal CLKTSV through buffer 238 as a read/write bus core signal RWBSCORE. Buffer 238 is activated by a write buffer enable signal WRTBUFFENCORE provided by the core command circuit 230. Data included in the read/write bus core signal RWBSCORE may be written to a memory array of the core die. The write command enable signal WRTCOM and the write clock WRTCLK from the core command circuit 230, and the read/write bus core signal RWBSCORE may be provided to a memory array of the core die 203.

Read data included in the read/write bus core signal RWBSCORE is provided from the core through the core read FIFO circuit 237 and buffer 235 to the TSV 234. The interface die 202 may be provided the read data at the set of data terminals 291, and an IF read data path 228 provides the read data through the buffer 225 to the data terminal DQ.

The interface die 202 and core die 203 of the memory device 200 may be tested, for example, as previously described, during manufacturing. The memory device 200 (e.g., the interface die 202 and/or core die 203) may be set in a test mode of operation to perform various test operations. During the test mode of operation, internal clocks may be utilized for performing the test operations. For example, internal clocks provided to the IF write data path 227 and/or to the IF read data path 228 may be active during test operations. Different test operations may use different ones of the internal clocks.

Figure 3:
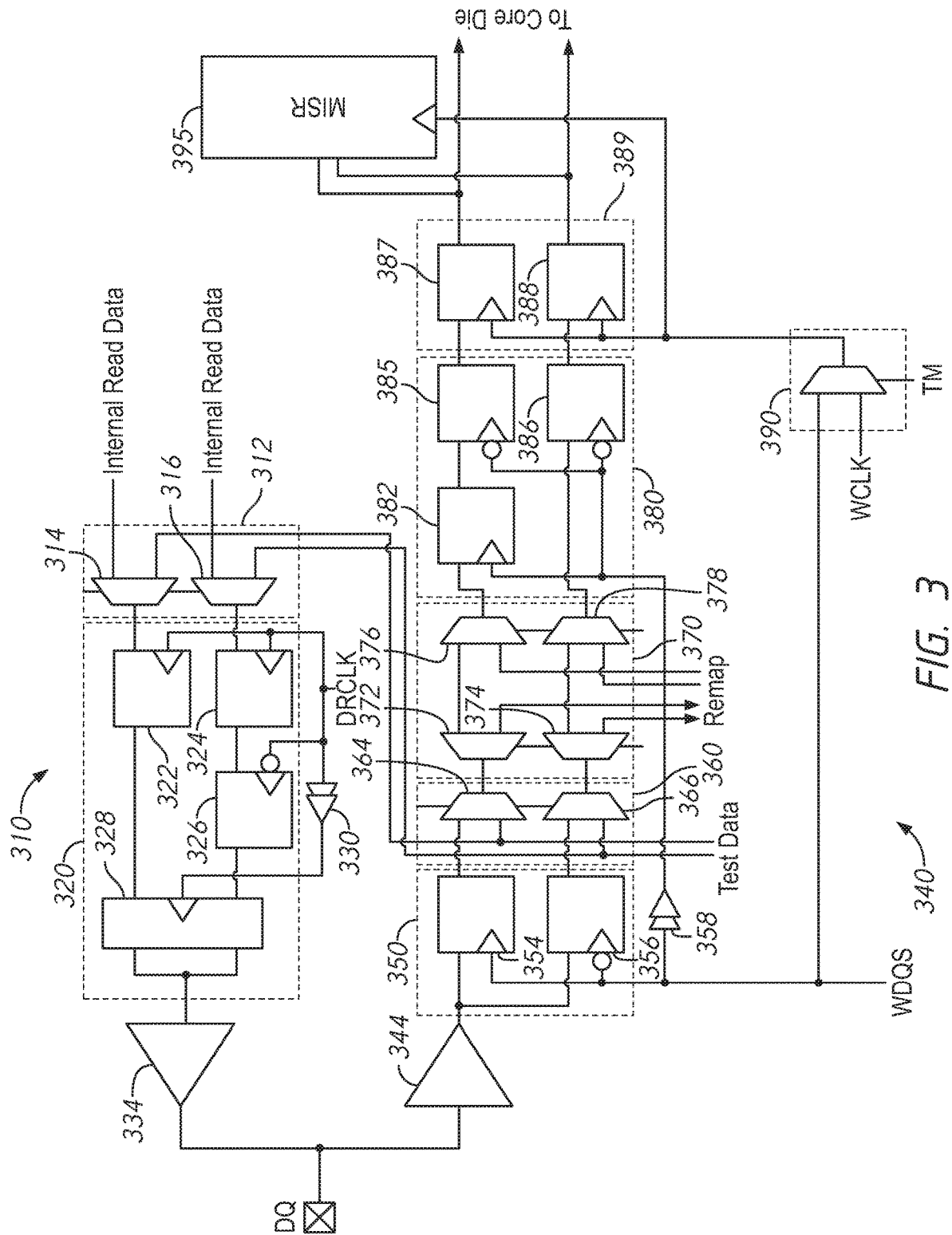
FIG. 3 is a schematic diagram of a read data path and write data path according to an embodiment of the disclosure.

FIG. 3 is a schematic diagram of a read data path 310 and write data path 340 according to an embodiment of the disclosure. In some embodiments of the disclosure, the read data path 310 and the write data path 340 may be included in the IF read data path 228 and the IF write data path 227 of the interface die 202 of FIG. 2, and/or included in the interface die 106 of FIG. 1. The read data path 310 and write data path 340 may be included in an HBM data queue (DQ) cell in some embodiments of the disclosure.

The read data path 310 includes a read data test circuit 312 that receives internal read data and test data. The internal read data may be provided, for example, from core die of an HBM. Test data may be provided by a test circuit, for example, a built-in self-test (BIST) circuit included in the interface die (not shown in FIG. 3). The read data test circuit 312 includes multiplexer circuits 314 and 316. Each of the multiplexer circuits 314 and 316 provides the internal read data (e.g., from core die) or the test data to a serializer circuit 320. For example, during a test mode of operation, the multiplexer circuits 314 and 316 may provide the test data to the serializer circuit 320 during some test operations and provide the internal read data for other test operations. The multiplexer circuits 314 and 316 may be controlled by a test control circuit (e.g., BIST circuit, not shown in FIG. 3). The read data test circuit 312 is optional, and in some embodiments of the disclosure, the read data test circuit 312 is omitted and the internal read data is provided to the serializer circuit 320.

The serializer circuit 320 arranges the parallel internal read data into serial internal read data that is provided to a read data buffer circuit 334. The serial internal read data includes consecutive bits of data. The read data buffer circuit 334 buffers the serial internal read data and provides the serial read data to the data terminal DQ.

Although different circuits may be used for the serializer circuit 320, the serializer circuit 320 shown in FIG. 3 includes latch circuits 322 and 324, latch circuit 326, and multiplexer 328. An internal read data clock DRCLK is provided to the latch circuits 322 and 324, latch circuit 326, and multiplexer 328. The DRCLK clock may be provided to the multiplexer 328 through a clock driver circuit 330. In operation, the latch circuits 322 and 324 receive and output the respective internal read data when the DRCLK clock transitions from a first clock level to a second clock level (e.g., from a low clock level to a high clock level). The latch circuit 322 provides the respective internal read data to the multiplexer 328 and the latch circuit 324 provides the respective internal read data to the latch circuit 326. The latch circuit 326 latches the internal read data, and provides the internal read data from the latch circuit 324 to the multiplexer 328 when the DRCLK clock transitions from the second clock level to the first clock level (e.g., from a high clock level to a low clock level). As the DRCLK clock continues to transition between the first and second clock levels, the internal read data provided to the latch circuits 322 and 324 in parallel is arranged into serial internal read data as the multiplexer 328 switches between providing the internal read data from the latch circuit 322 and from the latch circuit 326.

A write data buffer 344 receives and buffers write data, and provides serial internal write data to the write data path 340. The serial internal write data is provided to a deserializer circuit 350 of the write data path 340. The deserializer circuit 350 includes latch circuits 354 and 356. The latch circuit 354 latches the serial internal write data and provides the internal write data when a write data clock WDQS transitions from a first clock level to a second clock level (e.g., from a low clock level to a high clock level). The latch circuit 356 latches the serial internal write data and provides the internal write data when a write data clock WDQS transitions from the second clock level to the first clock level (e.g., from a high clock level to a low clock level). As the WDQS clock transitions between the first and second clock levels, the serial internal write data is latched as parallel internal write data. The internal write data is provided in parallel by the latch circuits 354 and 356 to a write data test circuit 360.

The write data test circuit 360 receives the internal write data and also receives test data. The test data may be provided by a test circuit, for example, a BIST circuit included in the interface die (not shown in FIG. 3). The write data test circuit 360 includes multiplexer circuits 364 and 366. Each of the multiplexer circuits 364 and 366 provides the internal write data or the test data to a remap circuit 370. For example, during a test mode of operation, the multiplexer circuits 364 and 366 may provide the test data to the remap circuit 370 during some test operations and provide the internal write data for other test operations. The multiplexer circuits 364 and 366 may be controlled by a test control circuit (e.g., a BIST circuit, not shown in FIG. 3). The write data test circuit 360 is optional, and in some embodiments of the disclosure, the write data test circuit 360 is omitted and the internal write data is provided by the deserializer circuit 350 to the remap circuit 370.

The remap circuit 370 may be used to remap the coupling of internal circuits and signal lines to conductive terminals, for example, conductive bumps of an interface die. The coupling of the circuits and signal lines may be remapped by the remap circuit 370 when one or more of the coupling and/or conductive terminals are defective. In this manner, the defective coupling and/or defective conductive terminal may be bypassed to "repair" an otherwise damaged device. The remap circuit 370 includes multiplexers 372 and 374, and multiplexers 376 and 378. The multiplexer 372 receives internal write data from the multiplexer 364, and the multiplexer 374 receives internal write data from the multiplexer 366. The multiplexer 372 provides the internal write data to the multiplexer 376 or to a respective remap signal line, and the multiplexer 374 provides the internal write data to the multiplexer 378 or to a respective remap signal line. The multiplexers 376 and 378 also receive internal write data from respective remap signal lines. The respective remap signals lines may be used, as previously described, to remap the coupling of circuits and signals lines to conductive bumps. The multiplexers 376 and 378 provide the internal write data from the multiplexers 372 and 374, respectively, or from the respective remap signal lines to a data timing circuit 380. The remap circuit 370 may remap the coupling according to a remap control circuit (not shown in FIG. 3). The remap circuit 370 is optional, and in some embodiments of the disclosure, the remap circuit 370 is omitted and the internal write data is provided to the data timing circuit 380 (e.g., from the write data test circuit 360, or if omitted, from the deserializer circuit 350).

The data timing circuit includes latch circuit 382, and latch circuits 385 and 386. The latch circuit 382, and latch circuits 385 and 386 are provided the WDQS clock through a clock driver circuit 358. The latch circuit 382 latches internal write data from the remap circuit 370 and provides the internal write data to the latch circuit 385 when the WDQS clock transitions from the first clock level to the second clock level. The latch circuits 385 and 386 latch the internal write data from the latch circuit 382 and from the remap circuit 370, respectively, when the WDQS clock transitions from the second clock level to the first clock level. As the WDQS clock transitions between the first and second clock levels, the internal write data is latched by the latch circuits 382, and 385 and 386, and provided as internal write data to a data output circuit 389.

The data output circuit 389 includes latch circuits 387 and 388. The latch circuits 387 and 388 latch the respective internal write data and provide the respective write data based on a clock. As will be described below, a write clock WCLK may be provided to the latch circuits 387 and 388 some test operations (e.g., first type of test operations) and the WDQS clock may be provided to the latch circuits 387 and 388 during other test operations (e.g., second type of test operations). For example, a multiplexer 390 is provided the WCLK clock and the WDQS clock, and may provide either the WCLK clock or the WDQS clock to the latch circuits 387 and 388. During a test mode of operation, the WCLK clock may be provided by the multiplexer 390 to the latch circuits 387 and 388 for some test operations (e.g., test operations using the DRCLK clock, WDQS clock, and the WCLK clock), and the WDQS clock may be provided to the latch circuits 387 and 388 during other test operations (e.g., test operations using the DRCLK clock and the WDQS clock). The test operations may be used, for example, to test AC characteristics of the read data path 310 and the write data path 340. The multiplexer 390 may be included in a clock control circuit. The clock control circuit may also include clock paths and clock buffer circuits for providing the clocks, for example, to the data output circuit 389.

The multiplexer 390 may be controlled by a test mode signal TM, which may be provided by a test mode controller (not shown) based on a mode of operation. For example, the test mode controller may provide the TM signal to control the multiplexer 390 to provide the WCLK clock to the latch circuits 387 and 388 for test operations that use at least both the WDQS clock (for the latch circuits 354 and 356) and the WCLK clock. In contrast, the test mode controller may provide the TM signal to control the multiplexer 390 to provide the WDQS clock to the latch circuits 387 and 388 during a test mode for test operations that use the WDQS clock without the WCLK clock. The test mode controller may be included in a built-in self-test circuit (BIST), for example. The BIST circuit may be included in an interface die of an HBM device (e.g., interface die 106 of FIG. 1 and/or interface die 202 of FIG. 2).

The deserializer circuit 350 deserializes serial write data from the write data buffer 344 and provides internal write data in parallel. For example, as the WDQS clock transitions between first and second clock levels, the serial data from the write data buffer 344 is latched by the latch circuit 354 and then the latch circuit 356 at different clock edges. The serial data is then provided in parallel (ignoring the write data test circuit 360 and the remap circuit 370) to the latch circuit 382, and then to the latch circuits 385 and 386.

In a test mode of operation for a first type of test operations, the latch circuits 387 and 388 receive the internal data from the latch circuits 385 and 386, respectively, and provide the internal write data based on the WCLK clock. The internal write data may be provided, for example, to core die of an HBM. The latch circuits 385 and 386 may receive the internal write data in parallel based on the WDQS clock and then provide the internal write data (e.g., to core die of the HBM) to the data output circuit 389. The data output circuit 389 then latches and provides the internal write data based on the WCLK clock domain, thus switching the timing of the internal write data from the WDQS clock domain to the WCLK clock domain.

In the test mode of operation for a second type of test operations, the latch circuits 387 and 388 receive the internal data from the latch circuits 385 and 386, respectively, and provide the internal write data based on the WDQS clock. The internal write data may be provided to a multiple-input signature register (MISR) 395, which may be accessed to analyze the internal write data (e.g., compare with expected data) provided by the latch circuits 387 and 388.

By using the WDQS clock for the latch circuits 387 and 388 during a test mode, fewer clocks may need to be adjusted during testing (e.g., testing of AC characteristics of the read and/or write paths), which may reduce test time. For example, rather than having to adjust (e.g., sweep) three different clocks (DRCLK, WDQS, and WCLK clocks) to identify suitable clock timing, adjusting with fewer clocks (e.g., DRCLK and WDQS clocks) may be better to identify suitable clock timing. An example of suitable timing for a clock is when circuits accurately latch data based on the clock. After setting the timing of the fewer clocks (e.g., DRCLK and WDQS clocks), a timing of the WCLK clock may be adjusted based on the timing set for the fewer clocks to identify a suitable timing for the WCLK clock. As a result, less test time may be needed to find suitable clock timing.

Figure 4:
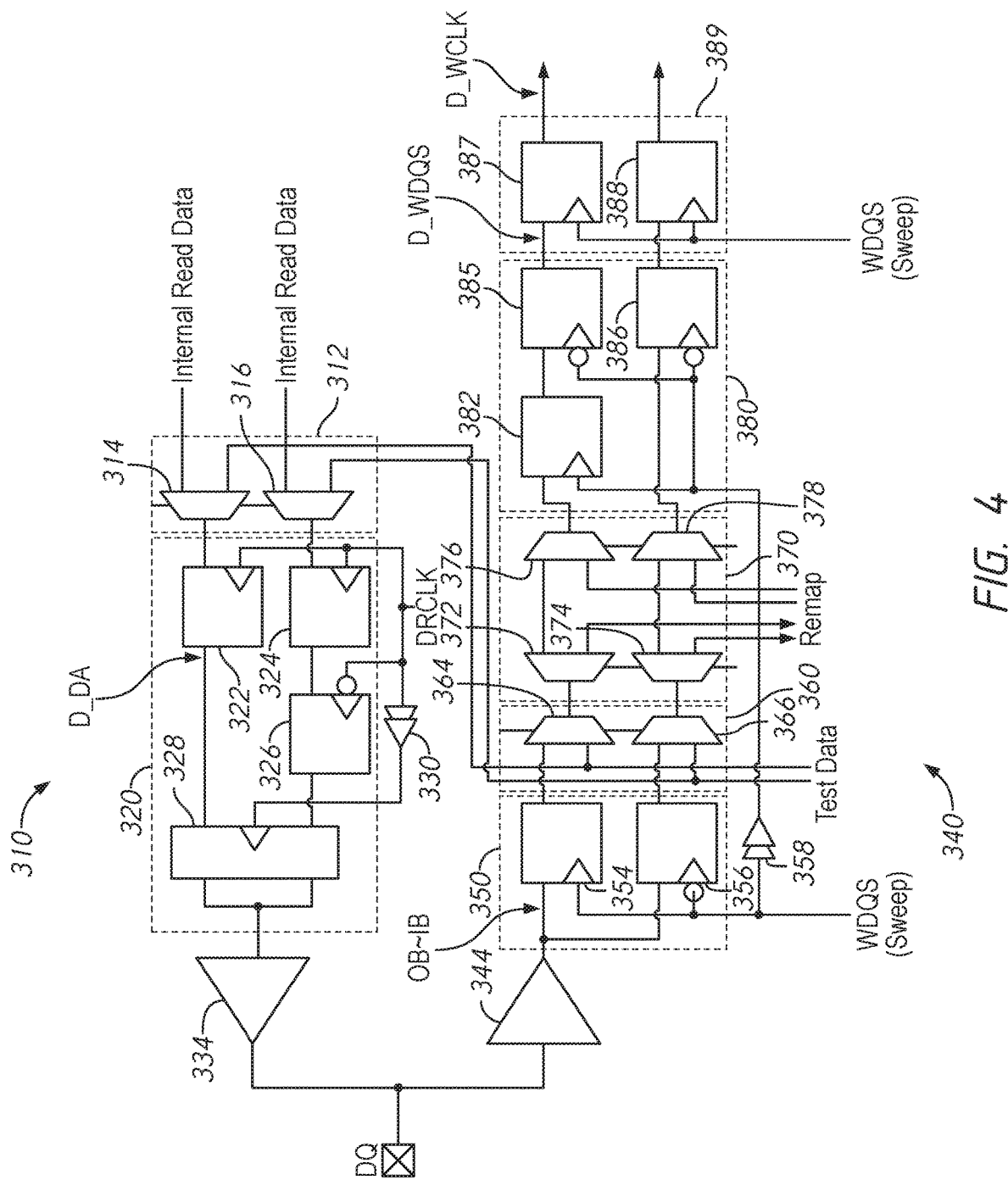
FIG. 4 is a block diagram of the read data path and write data path configured for a test mode according to an embodiment of the disclosure.
Figure 5:
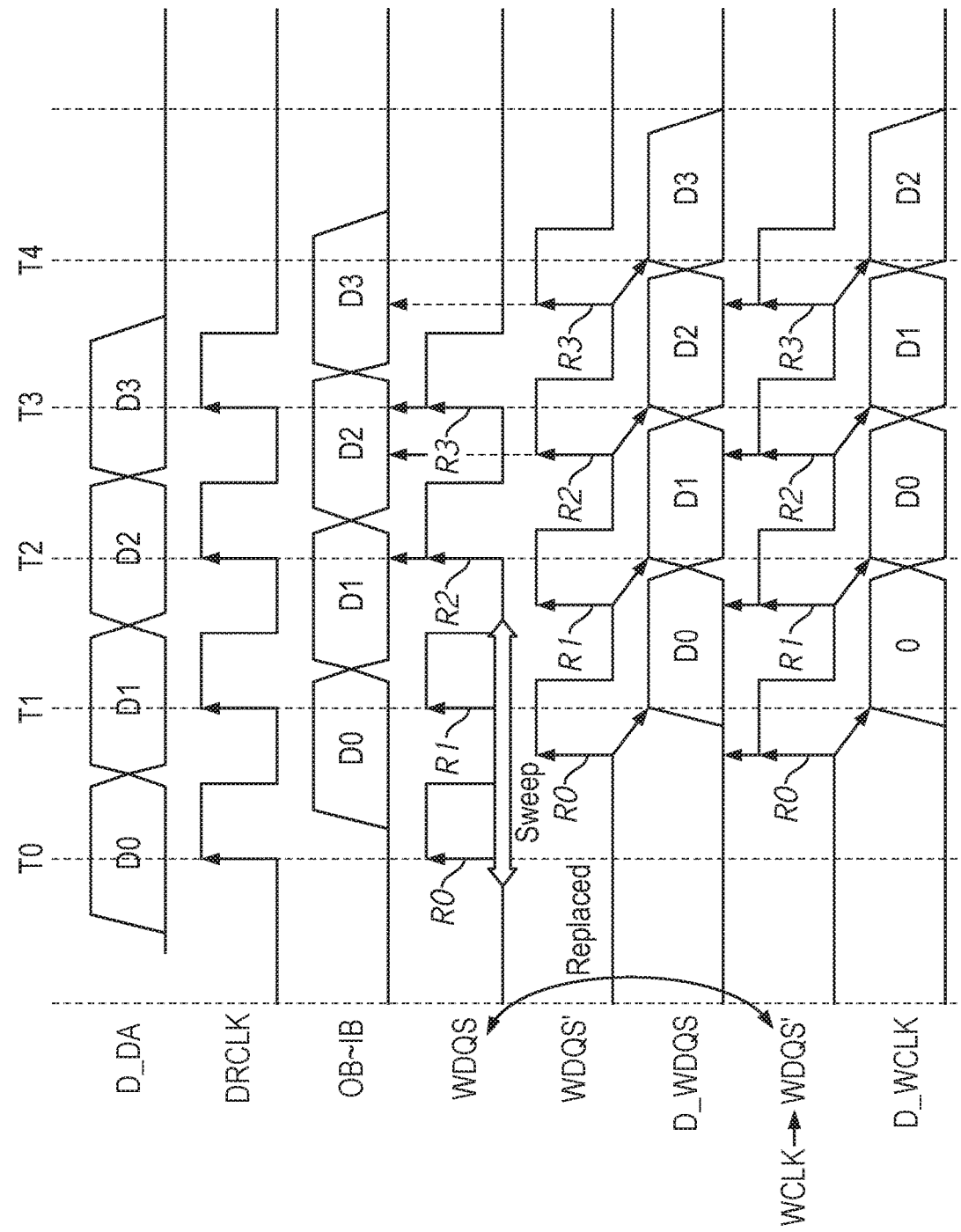
FIG. 5 is a timing diagram of various signals during operation of the read data path and write data path as configured in FIG. 4, according to an embodiment of the disclosure.

FIG. 4 is a block diagram of the read data path 310 and write data path 340 configured for a test mode according to an embodiment of the disclosure. In particular, the multiplexer 390 provides the WDQS clock to the latch circuits 387 and 388 (instead of providing the WCLK clock). Additionally, read data from the read data buffer 334 is provided to the write data buffer 344 during testing. FIG. 5 is a timing diagram of various signals during operation of the read data path 310 and write data path 340 as configured in FIG. 4 according to an embodiment of the disclosure.

In the example of FIG. 5, a timing for the DRCLK clock has already been set, and the WDQS clock provided to the latch circuits 354 and 356 is adjusted (e.g., swept) to identify a timing for the WDQS clock. The suitable timing for the DRCLK is shown by the DRCLK having rising clock edges at times T0-T3 corresponding to the data D0-D3 provided to the latch circuit 322 of the serializer circuit 320 as data D_DA. As previously described, the serializer circuit 320 arranges the parallel internal read data into serial internal read data that is provided to the read data buffer circuit 334, which buffers the serial internal read data and provides read data serially.

During some test operations, as previously described, the serial read data is provided to the write data buffer circuit 344. The write data buffer circuit 344 provides the serial read data as serial write data to the deserializer circuit 350. FIG. 5 shows the serial write data OB~IB provided to the latch circuit 354. The latch circuit 354 latches the serial write data OB~IB based on the WDQS clock. During testing, the WDQS clock is adjusted to identify a suitable timing for clocking the latch circuit 354 to latch the serial write data OB~IB. The WDQS clock is shown in FIG. 5 as having an initial timing with rising clock edges corresponding to times T0-T3. The timing of the WDQS clock may be adjusted by iteratively delaying the WDQS clock and testing for the latching of the serial write data OB~IB by the latch circuit 354. The WDQS clock having suitable timing is shown in FIG. 5 as the WDQS' clock. The suitable WDQS' clock timing causes the latch circuit 354 to latch the serial write data D0-D3 of OB~IB and provide the serial write data D0-D3 to the latch circuits 382 and then 385. For example, the WDQS clock is adjusted until the WDQS' clock has rising clock edges R0, R1, R2, and R3 aligned with the data D0, D1, D2, and D3, respectively, of the serial write data OB~IB. Comparing the original timing of the WDQS clock with the adjusted timing of the WDQS' clock, the rising clock edges R2 and R3 of the WDQS clock are "early" and would clock the latch circuit 354 to incorrectly latch data D1 and D2, whereas the rising clock edges R2 and R3 of the WDQS' clock have suitable timing and clock the latch circuit 354 to correctly latch data D2 and D3. As a result of the WDQS' clock with suitable timing, the data D0-D3 is provided by the latch circuit 354 through the latch circuits 382 and 385 to be provided as data D_WDQS.

As previously described, in the present example, the latch circuits 387 and 388 of the data output circuit 389 are provided the WDQS clock (instead of the WCLK) because of the test mode. As a result, the latch circuit 387 provides data D_WCLK that is offset by one unit interval from the data D_WDQS. For example, a rising clock edge R0 of the WDQS' clock clocks the latch circuit 387 at a time before the data D0 of the OB~IB data has propagated from the write data buffer circuit 344 to the latch circuit 387 as the D_WDQS data. The latch circuit 387 latches unknown data (shown in FIG. 5 as a low logic level) responsive to the R0 rising clock edge as a result. However, a rising clock edge R1 of the WDQS' clock clocks the latch circuit 387 at a time when the data D0 of the OB~IB has propagated to the latch circuit 387 as data D0 of the D_WDQS data. The latch circuit 387 latches the data and provides the data D0 of the D_WCLK data. Likewise, a rising clock edge R2 of the WDQS' clock clocks the latch circuit 387 to provide data D1 of the D_WCLK data and a rising clock edge R3 of the WDQS' clock clocks the latch circuit 387 to provide data D2 of the D_WCLK data. Typically, the rising clock edges R0, R1, R2, and R3 of the WCLK clock are used to latch and provide data D0, D1, D2, and D3, respectively. By providing the latch circuits 387 and 388 with the WDQS' clock instead of the WCLK clock during test mode, however, the rising clock edges R1, R2, and R3 of the WDQS' clock are used to clock the latch circuit 387 to latch and provide data D0, D1, and D2 respectively, for the D_WCLK data.

The data D0, D1, and D2 of the D_WCLK data is provided to the MISR 395, which latches the data D0, D1, and D2 based on the WDQS' clock. The latched data may be compared, for example, against expected data (e.g., D0, D1, and D2) to confirm operation of the read data path and/or write data path.

As previously described, providing the WDQS clock to the latch circuits 387 and 388 (and the MISR 395) instead of the WCLK clock may reduce the time for adjusting the multiple clocks for the read data path and write data path. As illustrated by the previously described example, adjusting (e.g., sweeping) the WDQS clock to identify suitable timing allows for adjusting one clock, rather than adjusting two clocks (e.g., the WDQS clock and the WCLK clock). After the timing of the WDQS clock is set, the WCLK clock can then be adjusted to find suitable timing.

While FIGS. 4 and 5 were described with reference to an example where the WDQS clock was provided in place of another clock (e.g., in place of the WCLK clock) during a test mode, substituting a clock that will have its timing adjusted for another clock in order to reduce a number of clocks being adjusted may be applied more generally for other clocks of the read data path and/or write data path.

Figure 6:
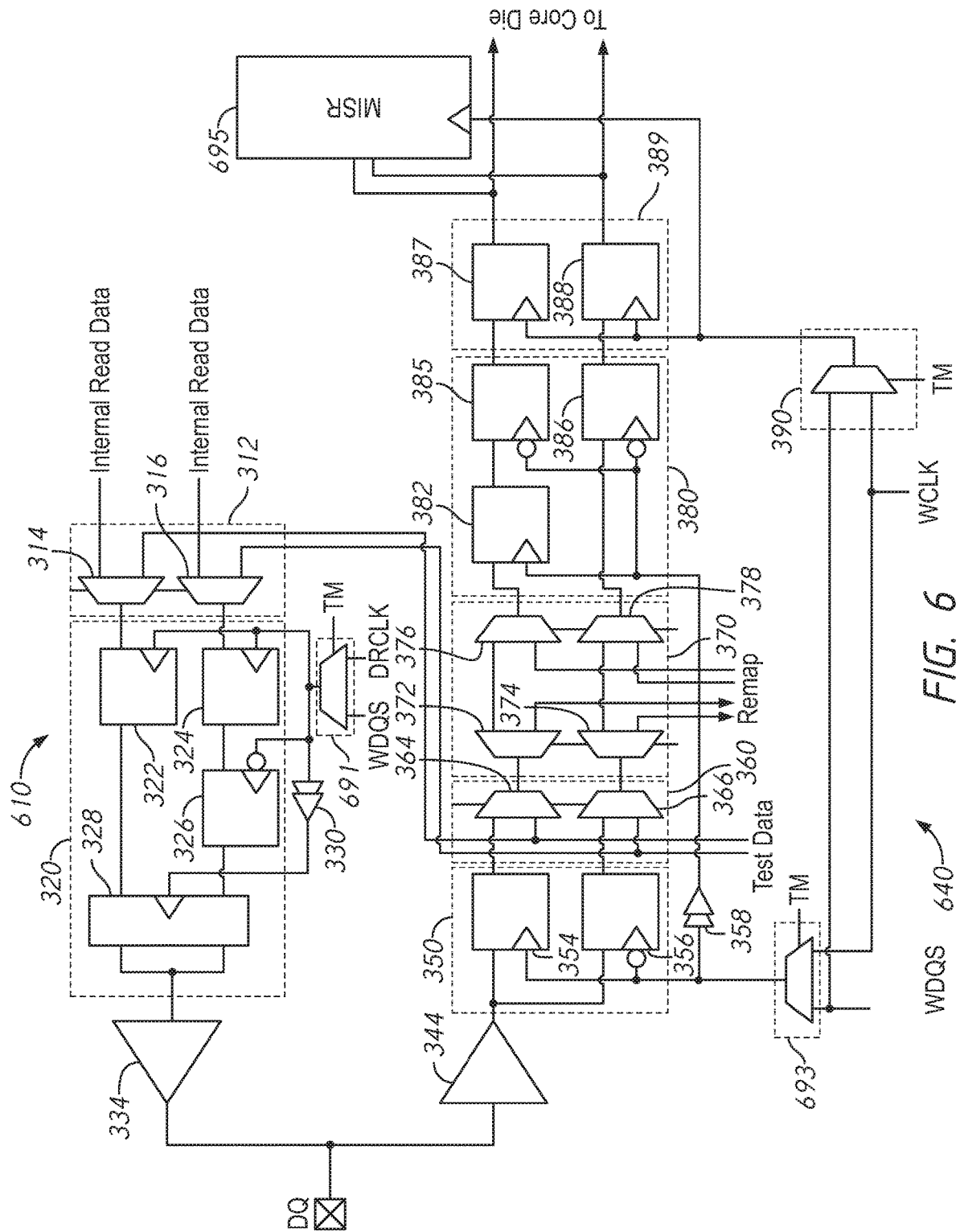
FIG. 6 is a schematic diagram of a read data path and write data path according to an embodiment of the disclosure.

FIG. 6 is a schematic diagram of a read data path 610 and write data path 640 according to an embodiment of the disclosure. In some embodiments of the disclosure, the read data path 610 and the write data path 640 may be included in the IF read data path 228 and the IF write data path 227 of the interface die 202 of FIG. 2. The read data path 610 and write data path 640 may be included in an HBM data queue (DQ) cell in some embodiments of the disclosure.

The read data path 610 and the write data path 640 include circuits similar to those of the read data path 310 and the write data path 340 previously described with reference to FIG. 3. The similar circuits included in the read data path 610 and the write data path 640 are identified in FIG. 6 using the same reference numbers as in FIG. 3.

In some embodiments of the disclosure, during a test mode of operation, an internal read data clock DRCLK may be provided to the serializer circuit 320 for some test operations and a write data clock WDQS may be provided to the serializer circuit 320 for other test operations. For example, a multiplexer 691 may provide the DRCLK or the WDQS clock to the serializer circuit 320 for timing the operation of the latch circuits 322, 324, and 326, and the multiplexer 328.

The multiplexer 691 may be controlled by a test mode signal TM, which may be provided by a test mode controller (not shown in FIG. 6) based on the test operations to be performed. For example, the test mode controller may provide the TM signal to control the multiplexer 691 to provide the DRCLK clock to the serializer circuit 320 for test operations including testing with the DRCLK clock and the WDQS clock. In contrast, the test mode controller may provide the TM signal to control the multiplexer 691 to provide the WDQS clock to the serializer circuit 320 for test operations including testing with the WDQS clock without the DRCLK. The test mode controller may be included in a built-in self-test circuit (BIST), for example. The BIST circuit may be included in an interface die of an HBM device (e.g., interface die 106 of FIG. 1 and/or the interface die 202 of FIG. 2).

In some embodiments of the disclosure, during a test mode of operation, the write data clock WDQS may be provided to the deserializer circuit 350 and the data timing circuit 380 for some test operations and the write clock WCLK may be provided to the deserializer circuit 350 and the data timing circuit 380 for other test operations. For example, the multiplexer 693 may provide the WCLK or the WDQS clock to the deserializer circuit 350 and the data timing circuit 380 for timing the operation of the circuits. During test operations including testing with the WDQS clock and the WCLK clock (e.g., for latch circuits 387 and 388), the multiplexer 693 may provide the WDQS clock the deserializer circuit 350 and the data timing circuit 380. However, during test operations including testing with the WCLK clock without the WDQS clock, the multiplexer 693 provides the WCLK clock for timing test operations for the deserializer circuit 350 and the data timing circuit 380.

As previously described, a write clock WCLK may be provided to the latch circuits 387 and 388 during some test operations and the WDQS clock may be provided to the latch circuits 387 and 388 during other test operations. For example, the multiplexer 390 provides the WCLK or WDQS clock to the latch circuits 387 and 388. The WCLK clock may be provided by the multiplexer 390 to the latch circuits 387 and 388 for test operations including testing with the WDQS clock (e.g., for latch circuits 354 and 356) and the WCLK clock. During test operations including testing with the WDQS clock without the WCLK clock, the WDQS clock may be provided to the latch circuits 387 and 388, and to the latch circuits 354 and 356.

In some embodiments of the disclosure, a clock control circuit may include multiplexer 691, multiplexer 693, and/or multiplexer 390. The clock control circuit may also include clock paths and clock buffer circuits for providing the clocks, for example, to the serializer circuit 320, deserializer circuit 350, and/or data output circuit 389.

Providing the WDQS clock to the serializer 320 may reduce the number of clocks that may be adjusted during some test operations, for example, compared to other test operations that include having to adjust the WDQS clock and the DRCLK clock to identify suitable timing for operation of the serializer 320. The time for the test operation may be reduced by this approach. The test operation may be used, for example, to test AC characteristics of the read data path 610 and/or the write data path 640.

Likewise, additionally or alternatively providing the WCLK to the deserializer circuit 350 during the test mode may also reduce the number of clocks that may be adjusted for various test operations. As previously described with reference to FIG. 3, during testing the data output circuit 389 may be provided the WDQS clock (instead of the WCLK clock) to identify a timing for the WDQS clock with regards to the deserializer circuit 350. The data output circuit 389 may then be provided the WCLK to identify a suitable timing for the operation of the data output circuit 389.

Generally, an internal clock may be provided to two different circuits and then the timing adjusted based on the operation of one of the circuits. After the timing of the internal clock is set (e.g., with a suitable timing), another internal clock may be provided to the other one of the circuits and the timing adjusted based on the operation of the other circuit according to the set timing of the first internal clock.

Various embodiments of the present disclosure have been described in detail with reference to the accompanying drawings. The detailed description included sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
    a first circuit in a data path, the first circuit configured to provide data based on a first clock;
    a second circuit in the data path, the second circuit configured to receive the data and configured to provide the data based on a second clock; and
    a clock control circuit configured to:
        provide a third clock as the first clock to the first circuit and a fourth clock as the second clock to the second circuit in a first type of test operation; and
        provide the third clock as the first clock to the first circuit and the third clock as the second clock to the second circuit in a second type of test operation.

2. The apparatus of claim 1 wherein the data path comprises a write data path, and wherein the first circuit comprises a deserializer circuit and the second circuit comprises a write data output circuit.

3. The apparatus of claim 2, further comprising a read data path configured to provide the data to the first circuit of the write data path.

4. The apparatus of claim 2 wherein the write data path further comprises a data timing circuit configured to provide write data to the write data output circuit based on the first clock.

5. The apparatus of claim 1 wherein the clock control circuit comprises a multiplexer configured to receive the third clock and the fourth clock, and further configured to provide the third clock as the second clock in the second type of test operation and provide the fourth clock as the second clock in the first type of test operation.

6. The apparatus of claim 5 wherein the clock control circuit further comprises a second multiplexer configured to receive the third clock and the fourth clock, and further configured to provide the fourth clock as the first clock in the second type of test operation and provide the third clock as the first clock in first type of test operation.

7. The apparatus of claim 1 wherein the second circuit is configured to switch the timing of the data from the first circuit from a clock domain of the first clock to a clock domain of the second clock.

8. The apparatus of claim 1, further comprising:
a third circuit in a second data path, the third circuit configured to receive data in parallel and provide the data serially, wherein the clock control circuit is further configured to provide the third clock to the third circuit in a second type of test operation, and provide a fifth clock to the third circuit in the first type of test operation.

9. The apparatus of claim 8 wherein the third circuit comprises a serializer circuit and the second data path comprises a read data path.

10. A method, comprising:
latching input data based on a first clock and providing the same as internal data;
latching and providing the internal data based on a second clock during first test operations;
latching and providing the internal data based on the first clock during second test operations; and
adjusting the first clock during the second test operations to identify a timing for the first clock for latching the input data.

11. The method of claim 10, further comprising deserializing the latched input data to provide internal data in parallel.

12. The method of claim 10, further comprising providing the internal data to a multiple-input signature register based on the second clock.

13. The method of claim 10, further comprising serializing internal read data based on a third clock during some test operations and serializing the internal read data based on the first clock during other test operations.

14. The method of claim 13, further comprising providing serialized internal read data as the input data during second test operations.

15. The method of claim 10, further comprising:
latching and providing the input data based on the second clock during third test operations;
latching and providing the internal data based on the second clock during the third test operations.

16. An apparatus, comprising:
a read data path including a serializer circuit, the serializer circuit configured to receive read data in parallel and provide the read data serially based on a first clock; and
a write data path including deserializer circuit and a write data output circuit, the deserializer circuit configured to receive write data serially and provide internal write data in parallel based on a second clock, the write data output circuit configured to receive the internal write data and provide the internal write data based on a third clock,
wherein a fourth clock is provided as the second clock and a fifth clock provided as the third clock during a first type of test operation, and
wherein the fourth clock is provided as the second clock and as the third clock during a second type of test operation.

17. The apparatus of claim 16, further comprising a multiplexer configured to receive the fourth and fifth clocks and configured to provide the fifth clock as the third clock during the first type of test operation and provide the fourth clock as the third clock as the third clock.

18. The apparatus of claim 17 wherein the read data path includes a second multiplexer configured to receive a sixth clock and the fourth clock and provide the sixth clock as the first clock to the serializer circuit during some test operations and provide the fourth clock as the first clock to the serializer circuit during other test operations.

19. The apparatus of claim 16, further comprising a multiple-input signature register configured to receive data from the write data output circuit based on the third clock during the second type of test operation.

20. The apparatus of claim 19 wherein the multiple-input signature register is configured to receive the internal write data from the write data output circuit offset by one unit interval.

* * * * *

UNITED STATES PATENT AND TRADEMARK OFFICE
CERTIFICATE OF CORRECTION

PATENT NO. : 10,839,889 B1
APPLICATION NO. : 16/591566
DATED : November 17, 2020
INVENTOR(S) : Hyunui Lee et al.

Page 1 of 1

It is certified that error appears in the above-identified patent and that said Letters Patent is hereby corrected as shown below:

In the Claims

| | Reads | Should Read |
|---|---|---|
| Column 12, Line 31 | "clock as the third clock as the third clock." | --clock as the third clock.-- |

Signed and Sealed this
Fifth Day of January, 2021

Andrei Iancu
*Director of the United States Patent and Trademark Office*